United States Patent
Eckhardt et al.

(10) Patent No.: US 6,583,657 B1
(45) Date of Patent: Jun. 24, 2003

(54) SINGLE-EDGE CLOCK ADJUSTMENT CIRCUITS FOR PLL-COMPATIBLE, DYNAMIC DUTY-CYCLE CORRECTION CIRCUITS

(75) Inventors: James Patrick Eckhardt, Pleasant Valley, NY (US); Byron Lee Krauter, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/177,391

(22) Filed: Jun. 20, 2002

(51) Int. Cl.[7] .............................................. H03K 3/017
(52) U.S. Cl. ...................................... 327/175; 327/172
(58) Field of Search ................................ 327/175, 171, 327/172, 173, 174, 35, 391, 437

(56) References Cited

U.S. PATENT DOCUMENTS

| | | | |
|---|---|---|---|
| 5,477,180 A | 12/1995 | Chen | 327/175 |
| 5,537,076 A * | 7/1996 | Fujii | 327/568 |
| 6,028,491 A * | 2/2000 | Stanchak et al. | 331/75 |
| 6,084,452 A | 7/2000 | Drost et al. | 327/175 |
| 6,507,220 B1 * | 1/2003 | Groen et al. | 326/93 |

* cited by examiner

Primary Examiner—Timothy P. Callahan
Assistant Examiner—Linh Nguyen
(74) Attorney, Agent, or Firm—Carr Law Firm, L.L.P.; Robert M. Carwell

(57) ABSTRACT

A duty cycle correction circuit is configured to adjust the duty cycle of a clock signal in a clock distribution network. The duty cycle correction circuit adjusts the duty cycle of the clock signal by adjusting the transitional delay in a single edge of each clock pulse of the clock signal without interrupting the other edge of each clock pulse of the clock signal. This feature enables the duty cycle correction circuit to adjust the duty cycle of the clock signal without interrupting the operation of a phase-locked loop (PLL) used in the clock distribution network. The duty cycle correction circuit includes a delay-control circuit coupled to a clock-inverter circuit. The delay-control circuit generates a delay-control voltage, which is provided to the clock-inverter circuit to control the transitional delay in a single edge of each clock pulse of the clock signal.

19 Claims, 4 Drawing Sheets

US 6,583,657 B1

SINGLE-EDGE CLOCK ADJUSTMENT CIRCUITS FOR PLL-COMPATIBLE, DYNAMIC DUTY-CYCLE CORRECTION CIRCUITS

BACKGROUND OF THE INVENTION

1. Field of the Invention

The invention relates generally to a clock scheme in a digital circuit and, more particularly, to a dynamic duty-cycle correction scheme using a single-edge clock adjustment technique.

2. Description of the Related Art

Some high-speed circuit techniques in digital-circuit design, such as separated-latch design, render chip performance sensitive to clock duty cycle. That is, duty cycle sometimes improves or degrades maximum chip frequency. Whether a particular asymmetry yields an improvement or degradation is a function of the asymmetry type and the critical timing path. The asymmetry type, for example, is determined by whether the clock remains at a logical 1 longer than a logical 0, or vice versa. If reversible, a particular clock asymmetry that results in chip performance degradation can yield a performance improvement when reversed.

The ideal clock distribution, therefore, should permit fine adjustments for the clock duty cycle via either primary input control or BIOS control bits. Furthermore, these adjustments should be invariant to changes in process, temperature, and supply voltage. For example, settings on a first chip that yield a 10-picosecond adjustment should yield the same 10-picosecond adjustment on a second chip regardless of temperature, process, and supply voltage of the second chip.

Because this degree of invariance is only achievable via active feedback control, another design restriction has to be mentioned. The active feedback loop employed in the duty cycle correction circuit should not interfere with the feedback loop employed in a phase-locked loop (PLL). At best, such interference between the two feedback loops would increase clock jitter. At worst, such interference might render one or both circuits unstable.

Therefore, there is a need for a mechanism that permits fine adjustments of the clock duty cycle, achieves the desired invariance to process, temperature, and supply voltage, and does not interfere with the operation of the PLL.

SUMMARY OF THE INVENTION

A duty cycle correction circuit has a delay-control circuit coupled to a clock-inverter circuit. The delay-control circuit includes first and second voltage dividers coupled to a differential amplifier coupled to a stability circuit. The first voltage divider receives a first clock signal. The first and second voltage dividers generate first and second output voltage, respectively. The differential amplifier has first and second input terminals coupled to the first and second output voltages, respectively, and outputs a third output voltage. The stability circuit receives the third output voltage and outputs a delay-control voltage. The clock inverter circuit receives a second clock signal and is coupled to the delay-control voltage. The delay-control voltage has first, second, third, and fourth field effect transistors (FETs).

The first FET has a source, a gate, and a drain. The gate of the first FET is coupled to the delay-control voltage, and the source of the first FET is coupled to the first bias voltage.

The second FET has a source, a gate, and a drain. The source of the second FET is coupled to the first bias voltage. The gate of the second FET receives the second clock signal, and the drain of the second FET outputs the third clock signal.

The third FET has a source, a gate, and a drain. The source of the third FET is coupled to the drain of the first FET, and the gate of the third FET is coupled to the gate of the second FET. The drain of the third FET is coupled to the drain of the second FET.

The fourth FET has a source, a gate, and a drain. The source of the fourth FET is coupled to the second bias voltage, and the gate of the fourth FET is coupled to the gates of the second and third FETs. The drain of the fourth FET is coupled to the drains of the second and third FETs.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The principles of the present invention and their advantages are best understood by referring to the illustrated operations of the embodiments depicted in FIGS. 1–4.

Figure 1:
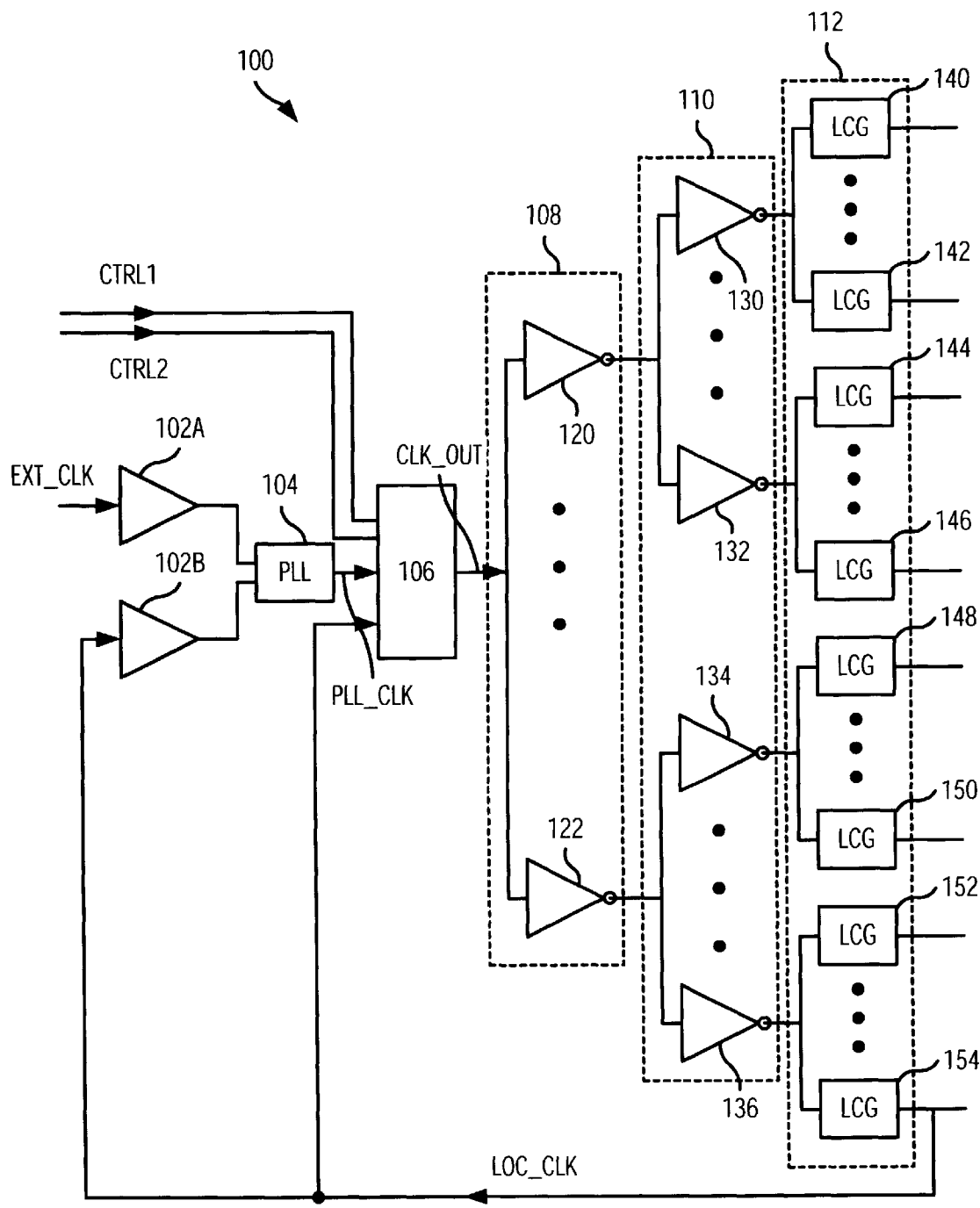
FIG. 1 depicts a block diagram of a VLSI clock distribution network according to the present invention.

In FIG. 1, a reference numeral 100 indicates a block diagram of a VLSI clock distribution network embodying the present invention. The VLSI clock distribution network 100 includes a clock receiver 102A, a duplicate clock receiver 102B, a phase-locked loop (PLL) 104, a duty cycle correction circuit 106, a first inverter stage 108, a second inverter stage 110, and a local clock generator (LCG) stage 112. The number of inverter stages required in a clock distribution network is a function of the size of the VLSI chip and the number and quality of clock signals required. Therefore, the number of inverter stages of the VLSI clock distribution network 100 may vary depending on a specific implementation without departing from the spirit of the present invention. The first inverter stage 108 includes a plurality of inverters such as a first inverter 120 and a second inverter 122. Similarly, the second inverter stage 110 includes a plurality of inverters such as a third inverter 130, a fourth inverter 132, a fifth inverter 134, and a sixth inverter 136. The LCG stage 112 includes a plurality of LCGs such as a first LCG 140, a second LCG 142, a third LCG 144, a fourth LCG 146, a fifth LCG 148, a sixth LCG 150, a seventh LCG 152, and an eighth LCG 154. As indicated in FIG. 1, the number of inverters and LCGs in each stage may vary depending on specific implementations without departing from the spirit of the present invention.

The clock receiver 102A receives an external clock signal EXT_CLK. Preferably, the EXT_CLK comes from an external clock generator (now shown). The clock receiver 102A is connected to the PLL 104 and drives the PLL 104 with a copy of the EXT_CLK. The PLL 104 is connected to the duty cycle correction circuit 106 and drives the duty cycle correction circuit 106 with a PLL-derived clock signal PLL_CLK. Typically, while the PLL_CLK may differ from the EXT_CLK in frequency, some integer multiple of the EXT_CLK has a constant phase relationship to the PLL_CLK. The duty cycle correction circuit 106 is connected to the first inverter stage 108, which is connected to the second inverter stage 110. The second inverter stage 110 is connected to the LCG stage 112. The duty cycle correction circuit 106 is also connected to the LCG stage 112 to receive a local clock LOC_CLK from the LCG stage 112.

Specifically, the duty cycle correction circuit 106 is connected to the first inverter 120 and the second inverter 122. The first inverter 120 is connected to the third inverter 130 and the fourth inverter 132, whereas the second inverter 122 is connected to the fifth inverter 134 and the sixth inverter 136. The third inverter 130 is connected to the first LCG 140 and the second LCG 142. The fourth inverter 132 is connected to the third LCG 144 and the fourth LCG 146. The fifth inverter 134 is connected to the fifth LCG 148 and the sixth LCG 150. The sixth inverter 136 is connected to the seventh LCG 152 and the eighth LCG 154. The eighth LCG 154 is connected to the duty cycle correction circuit 106 to provide the LCG_CLK as a feedback signal to the duty cycle correction circuit 106.

Once the duty cycle correction circuit 106 receives the PLL_CLK from the PLL 104, the duty cycle correction circuit 106 initially adjusts the PLL_CLK and outputs an output clock CLK_OUT to the first inverter stage 108. The CLK_OUT travels through the second inverter stage 110 and the LCG stage 112, and is provided to the duplicate clock receiver 102B and the duty cycle correction circuit 106 as the LOC_CLK.

The duty cycle correction circuit 106 actively adjusts the transitional delay in a single edge (i.e., either a rising edge or a falling edge) of the PLL_CLK, thereby fine-tuning the duty cycle of the PLL_CLK without interfering the operation of the PLL 104. This single-edge adjustment scheme is an intentional effort not to affect the behavior of the PLL 104. Details on how to control the duty cycle are discussed further below in reference to FIGS. 2 and 3.

Typically, PLLs such as the PLL 104 use digital phase comparators (not shown) to detect phase errors between an external reference signal such as the EXT_CLK and an internal feedback signal such as the LOC_CLK. Such digital phase comparators employ edge-triggered latches (not shown) and thus are sensitive to transitions in only a single clock edge of each clock pulse. That is, the digital phase comparators sample either the arrival time difference between two rising clock edges or two falling clock edges. If the duty cycle correction circuit 106 can be restricted to making adjustments on a single clock edge that is not sampled by the digital comparators, then its adjustments will not interfere with the behavior of the PLL 104. For example, if the digital comparators in the PLL 104 sample a rising clock edge of each clock pulse input to the PLL 104, then the duty cycle correction circuit 106 can be restricted to making adjustments on a falling clock edge of each clock pulse input to the PLL 104. In FIG. 1, the duty cycle correction circuit 106 is configured to adjust the transitional delay in a single clock edge of the PLL_CLK with duty cycle control bits CTRL1 and CTRL2. Preferably, the CTRL1 and CTRL2 are input from a configuration register (not shown). A more detailed configuration of a duty cycle correction circuit 106 is discussed further below in reference to FIG. 2.

As mentioned above, each LCG in the LCG stage 112 generates a local clock signal LOC_CLK, which is provided to a plurality of local logic elements (not shown). The LOC_CLK is also provided to the duplicate clock receiver 102B and the duty cycle correction circuit 106. For example, the eighth LCG 154 is connected to the duplicate clock receiver 102B and the duty cycle correction circuit 106.

Figure 2:
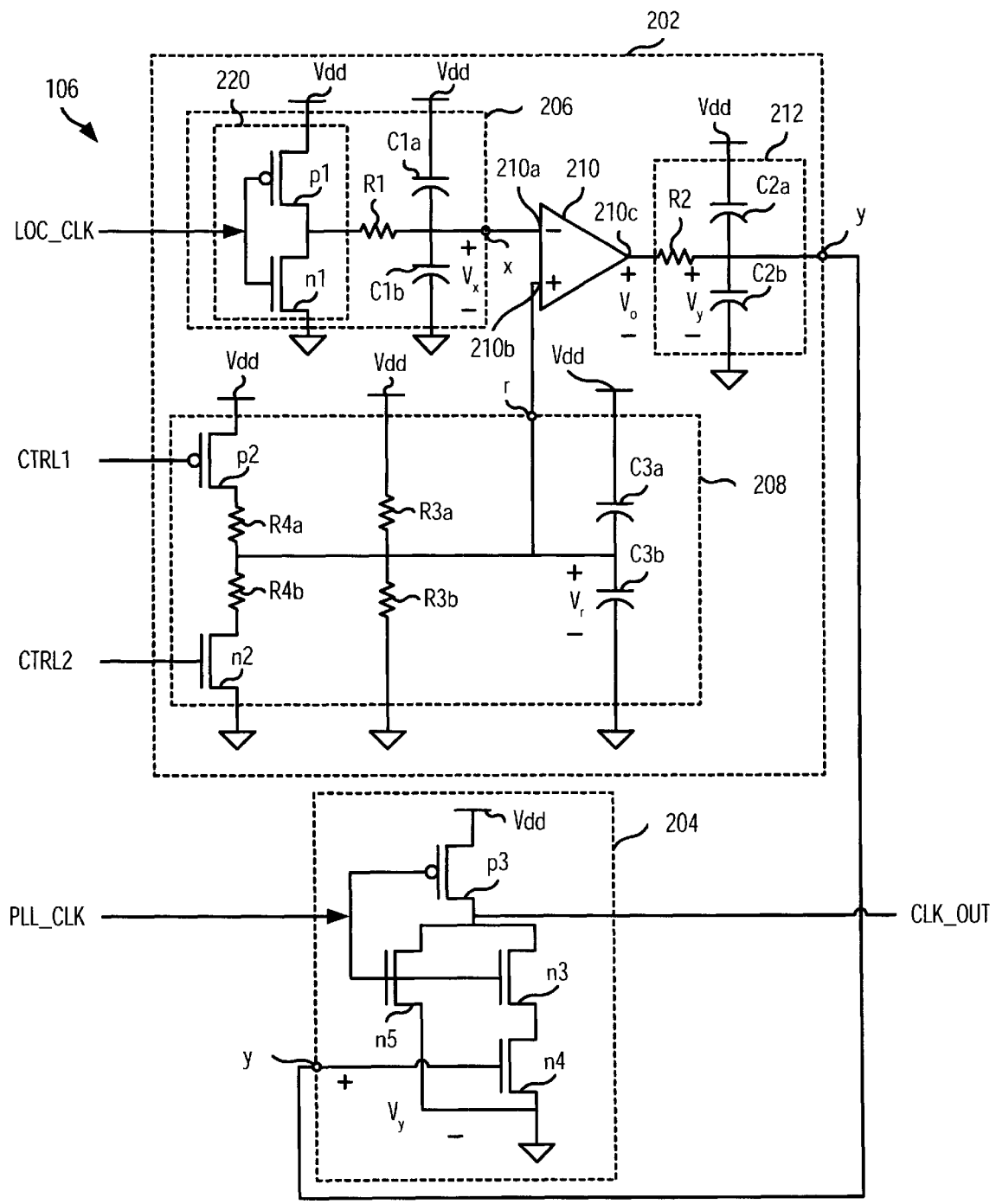
FIG. 2 depicts a schematic circuit diagram of one embodiment of a duty cycle correction circuit of FIG. 1.

Now referring to FIG. 2, a preferred embodiment of the duty cycle correction circuit 106 of FIG. 1 is shown to include a delay-control circuit 202 and a first clock-inverter circuit 204. The delay-control circuit 202 receives the LOC_CLK from the eighth LCG 154 of FIG. 1 and provides a delay-control voltage Vy to the first clock-inverter circuit 204 through a node y. The delay-control circuit 202 comprises a first voltage divider 206, a second voltage divider 208, a differential amplifier 210, and a stability circuit 212.

The first voltage divider 206 comprises transistors p1 and n1, a resistor R1, and capacitors C1a and C1b. Preferably, the transistors p1 and n1 are respectively p-channel and n-channel metal-oxide-semiconductor field effect transistors (MOSFETs). The transistors p1 and n1 are connected in series between ground and a supply voltage Vdd to form a first transistor inverter 220. Typically, a MOSFET has three terminals, i.e., a gate, a drain, and a source. The biasing scheme of the terminals of a MOSFET is well known in the field of the invention, and thus is mentioned herein without numbering such terminals in the drawings.

In the first voltage divider 206, the source of the transistor p1 is connected to the supply voltage Vdd, whereas the source of the transistor n1 is connected to ground. The drain of the transistor p1 is connected to the drain of the transistor n1. The gates of the transistors p1 and n1 are connected together to the eighth LCG 154 of FIG. 2 to receive the LOC_CLK from the eighth LCG 154. The drains of the transistors p1 and n1 are connected to one terminal of the resistor R1. The other terminal of the resistor R1 is connected to the node x. The capacitor C1a is connected between the node x and the supply voltage Vdd, whereas the capacitor C1b is connected between the node x and ground. Therefore, the node x carries an output voltage Vx of the first voltage divider 206. The output voltage Vx is determined as follows:

$$Vx = Vdd*(1\text{-duty cycle of LOC\_CLK})$$

The second voltage divider 208 comprises transistors p2 and n2, resistors R3a, R3b, R4a, and R4b, and capacitors C3a and C3b. The source of the transistor p2 is connected to the supply voltage Vdd, whereas the source of the transistor n2 is connected to ground. The drain of the transistor p2 is connected to the resistor R4a, whereas the drain of the transistor n2 is connected to the resistor R4b. The gate of the transistor p2 receives the CTRL1, whereas the gate of the transistor n2 receives the CTRL2. As mentioned above, the CTRL1 and CTRL2 are preferably input from a configuration register (not shown). The resistor R4a is connected to the resistor R4b at a node r. The resistor R3a is connected between the supply voltage Vdd and the node r, whereas the resistor R3b is connected between ground and the node r. Similarly, the capacitor C3a is connected between the supply voltage Vdd and the node r, whereas the capacitor C3b is connected between ground and the node r. Therefore, the node r carries an output voltage Vr of the second voltage divider 208.

The differential amplifier 210 has an inverting input terminal 210a and a non-inverting input terminal 210b and an output terminal 210c. The inverting input terminal 210a has an inverting input voltage $V_-$, whereas the non-inverting input terminal 210b has a non-inverting input voltage $V_+$. The output voltage Vo is determined by a differential gain DG of the differential amplifier 210, the inverting input voltage $V_-$, and the non-inverting input voltage $V_+$:

$$Vo=DG*(V_+ - V_-)$$

Thus, an output voltage Vo of the output terminal 210c is proportionate to $(V_+ - V_-)$. As shown in FIG. 2, the inverting input terminal 210a is connected to the node x, whereas the non-inverting input terminal 210b is connected to the node r. This connection is based on the assumption that LOC_CLK is logically equal to the CLK_OUT. If LOC_CLK is the logical inverse of CLK_OUT, the opposite connections should be made. That is, the inverting input terminal 210a should be connected to the node r, and the non-inverting terminal 210b should be connected to the node x. A detailed analysis of this assumption is provided further below.

The stability circuit 212 comprises a resistor R2 and capacitors C2a and C2b. The resistor R2 is connected between the output terminal 210c and the node y. The capacitor C2a is connected between the supply voltage Vdd and the node y, whereas the capacitor C2b is connected between ground and the node y.

The first clock-inverter circuit 204 comprises transistors p3, n3, n4, and n5. The source of the transistor p3 is connected to the supply voltage Vdd. The drain of the transistor p3 is connected to the drains of the transistors n3 and n5, and provides the CLK_OUT to the first inverter stage 108 of FIG. 1. The source of the transistor n3 is connected to the drain of the transistor n4, whereas the sources of the transistors n4 and n5 are connected to ground. The gates of the transistors p3, n3, and n5 are connected to the PLL 104 of FIG. 1 to receive the PLL_CLK from the PLL 104. The gate of the transistor n4 is connected to the node y. The first clock-inverter circuit 204 is configured to adjust the transitional delay in the falling edge of each clock pulse of the CLK_OUT, which subsequently affects the duty cycle of LOC_CLK, without changing the transitional delay in the rising edge of each clock pulse of the CLK_OUT. This is because the delay-control voltage Vy controls the transistor n4. If the delay-control voltage Vy is above the threshold voltage of the transistor n4, the transistor n4 is turned on, thereby providing an additional path to pull down the CLK_OUT when the PLL_CLK transitions from a logical 0 to a logical 1. This additional path comprising the transistors n3 and n4 decreases the transitional delay in the falling edge of the CLK_OUT. On the other hand, if the delay-control voltage Vy is below the threshold voltage of the transistor n4, the transistor n4 is turned off, thereby eliminating the additional path to pull down the CLK_OUT when the PLL_CLK transitions from a logical 0 to a logical 1. The absence of an additional path comprising the transistors n3 and n4 increases the transitional delay in the falling edge of the CLK_OUT. However, the delay-control voltage does not affect the rising edge delay of the CLK_OUT, because only the transistor p3 determines the rising edge delay of the CLK_OUT.

Therefore, the first clock-inverter circuit 204 is used in the duty cycle correction circuit 106, when the PLL 104 of FIG. 1 adjusts the rising edge of each clock pulse of the PLL_CLK. This ensures that the duty cycle correction circuit 106 does not affect the functions performed by the PLL 104.

The following conditions are critical to the successful operation of the delay-control circuit 202:

1. The resistor R1 has resistance R1, and two capacitors C1a and C1b each have capacitance C1. The resistors R3a and R3b each have resistance R3. The resistors R4a and R4b each have resistance R4. The capacitors C3a and C3b each have capacitance C3. The capacitors C2a and C2b each have capacitance C2. The resistor R2 has resistance R2.

2. When employed in the VLSI clock distribution network 100, the LOC_CLK logically equals the CLK_OUT. That is, the LOC_CLK is not an inverted version of the CLK_OUT. If the LOC_CLK happens to be an inverted version of the CLK_OUT, the aforementioned assumption that the output voltage Vx is proportionate to the output voltage Vo is incorrect. In that case, the node x should be connected to the non-inverting input terminal 210b, whereas the node r should be connected to the inverting input terminal 210a.

3. To avoid a PLL lock-up condition, the maximum delay variation of the first clock-inverter circuit 204 is less than one half the clock cycle time of the PLL_CLK.

4. Transistors n1 and p1 have approximately equal device strengths. This guarantees that the first transistor inverter 220 to switch at 0.5 Vdd 5. The resistance R1 is much larger than the resistances of the transistors n1 and p1. This guarantees that the time required to charge and discharge the capacitors C1a and C1b is dominated by the resistance R1 rather than the device characteristics of the transistors n1 and p1.

6. The time constant R1*C1 is much larger than the clock period of the LOC_CLK. This ensures that, after the duty cycle correction circuit 106 reaches a steady state, the average dc value of the output voltage Vx is equal to the supply voltage Vdd times the duty cycle of the LOC_CLK, and furthermore that the ac ripples on the node x are small.

7. The differential amplifier 210 has a high differential gain (DG) and a small common-mode error.

8. To help ensure stability of the duty cycle correction circuit 106, the time constant R2*C2 is much larger than the time constant R1*C1.

9. To filter power supply noise, the capacitors C1a, C1b, C2a, C2b, C3a, and C3b are symmetrically terminated to both the supply voltage Vdd and ground.

10. To make fine duty cycle adjustments, the resistance R4 is much greater than the resistance R3, and the transistors n2 and p2 are much stronger than the resistance R4.

Given these conditions, the duty cycle correction circuit 106 has three settings depending on the combination of the CTRL1 and the CTRL2. When the CTRL1 and the CTRL2 have different bits, both the transistors p2 and n2 are either off or on. In this case, the duty cycle correction circuit 106 produces a 50-percent duty cycle. When both the transistors p2 and n2 are off or on, the transistors p2 and n2 and the resistors R4a and R4b do not affect the output voltage Vr. Therefore, the output voltage Vr is 0.5 Vdd. For example, if an initial duty cycle is 60 percent, the output voltage Vx has an average dc value of 0.4 Vdd. Therefore, the output voltage Vo at the output terminal 210c outputs the supply voltage Vdd, because the inverting input terminal 210a is lower in voltage than the non-inverting input terminal 210b. This turns on the transistor n4, thereby decreasing the transitional delay in the falling edges of the CLK_OUT, which means decreased duty cycle of the CLK_OUT. Therefore, the duty cycle correction circuit 106 reaches a steady state at a 50-percent duty cycle.

Alternatively, if the initial duty cycle is 40 percent, the output voltage Vx has an average dc value of 0.6 Vdd. Therefore, the output voltage Vo at the output terminal 210c outputs zero voltage, because the inverting input terminal 210a is higher in voltage than the non-inverting input terminal 210b. This turns off the transistor n4, thereby increasing the transitional delay in the falling edges of the CLK_OUT, which means increased duty cycle of the CLK_OUT. Therefore, the duty cycle correction circuit 106 reaches a steady state at a 50-percent duty cycle.

When both the CTRL1 and the CTRL2 are a logical 1, the transistor p2 is off, and the transistor n2 is on. In this case, the duty cycle correction circuit 106 produces a slightly asymmetric LOC_CLK with logical-1 pulse width slightly longer than logical-0 pulse width in a given clock cycle. When the transistor p2 is off and the transistor n2 is on, the resistor R4a and the transistor p2 are taken out. Thus, the output voltage Vr is determined by the resistors R4b, R3a, and R3b:

$$Vr=[(R3//R4)/(R3+R3//R4)]*Vdd, \text{ where } R3//R4=R3*R4/(R3+R4).$$

Since R4 is much larger than R3, R3//R4 is only slightly smaller than R3. Therefore, Vx is slightly lower than 0.5 Vdd. For example, let us assume Vr equals 0.45 Vdd. Now assuming that the initial LOC_CLK has a 50-percent duty cycle, Vx has an average dc value of 0.5 Vdd. Since the inverting input terminal 210a has a higher voltage than the non-inverting input terminal 210b, the output voltage Vo approaches to zero voltage, thereby increasing the transitional delay in the falling edges of the CLK_OUT. Since an increased transitional delay in the falling edges increases the duty cycle of the CLK_OUT, the output voltage Vx drops slightly below 0.5 Vdd and ultimately equals the output voltage Vr at the node r in a steady state. Therefore, the LOC_CLK reaches a steady state at slightly over a 50-percent duty cycle.

Alternatively, if the output voltage Vr equals 0.45 Vdd and the LOC_CLK initially has a 60-percent duty cycle, the output voltage Vx has an average dc value of 0.4 Vdd. Since the inverting input terminal 210a has a lower voltage than the non-inverting input terminal 210b, the output voltage Vo approaches to the supply voltage Vdd, thereby decreasing the transitional delay in the falling edges of the CLK_OUT. Since a decreased transitional delay in the falling edges decreases the duty cycle of the CLK_OUT, the output voltage Vx rises slightly above 0.4 Vdd and ultimately equals the output voltage Vr at the node r in a steady state. Therefore, the LOC_CLK reaches a steady state at slightly over a 50-percent duty cycle.

When both the CTRL1 and the CTRL2 are a logical 0, the transistor p2 is on, and the transistor n2 is off. In this case, the duty cycle correction circuit 106 produces a slightly asymmetric LOC_CLK with logical-1 pulse width slightly shorter than logical-0 pulse width in a given cycle. When the transistor p2 is on and the transistor n2 is off, the resistor R4b and the transistor n2 are taken out. Thus, the output voltage Vr is determined by the resistors R4a, R3a, and R3b:

$$Vr=[R3/(R3+R3//R4)]*Vdd, \text{ where } R3//R4=R3*R4/(R3+R4).$$

Since R4 is much larger than R3, R3//R4 is only slightly smaller than R3. Therefore, Vx is slightly higher than 0.5 Vdd. For example, let's assume Vr equals 0.55 Vdd. Now assuming that the initial LOC_CLK has a 50-percent duty cycle, Vx has an average dc value of 0.5 Vdd. Since the inverting input terminal 210a has a lower voltage than the non-inverting input terminal 210b, the output voltage Vo approaches to the supply voltage, thereby deceasing the transitional delay in the falling edges of the CLK_OUT. Since a decreased transitional delay in the falling edges decreases the duty cycle of the CLK_OUT, the output voltage Vx rises slightly above 0.5 Vdd and ultimately equals the output voltage Vr at the node r in a steady state. Therefore, the LOC_CLK reaches a steady state at slightly under a 50-percent duty cycle.

Alternatively, if the output voltage Vr equals 0.55 Vdd and the LOC_CLK initially has a 40-percent duty cycle, the output voltage Vx has an average dc value of 0.6 Vdd. Since the inverting input terminal 210a has a higher voltage than the non-inverting input terminal 210b, the output voltage Vo approaches zero voltage, thereby increasing the transitional delay in the falling edges of the CLK_OUT. Since an increased transitional delay in the falling edges of the CLK_OUT increases the duty cycle of the CLK_OUT, the output voltage Vx falls slightly above 0.6 Vdd and ultimately equals the output voltage Vr at the node r in a steady state. Therefore, the LOC_CLK reaches a steady state at slightly under a 50-percent duty cycle.

Figure 3:
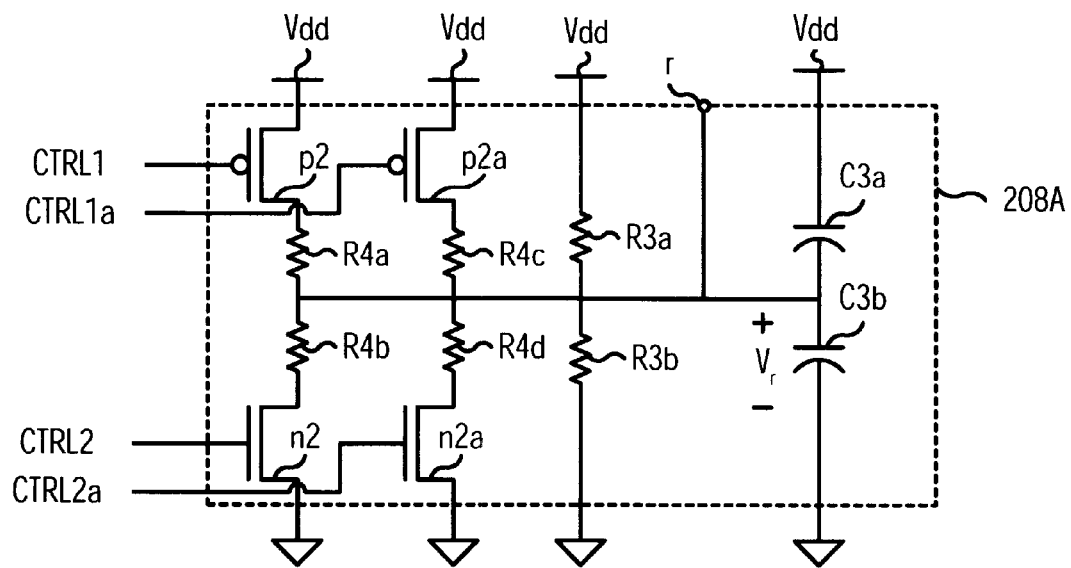
FIG. 3 depicts another embodiment of a second voltage divider of FIG. 2 according to the present invention.

Now referring to FIG. 3, a reference numeral 208A indicates a third voltage divider, which is another embodiment of the second voltage divider 208 of FIG. 2. The third voltage divider 208A has all the components of the second voltage divider 208, and additionally has transistors p2a and n2a, and resistors R4c and R4d. The source of the transistor p2a is connected to the supply voltage Vdd, whereas the source of the transistor n2a is connected to ground. The drain of the transistor p2a is configured to receive a control bit CTRL1a, whereas the drain of the transistor n2a is configured to receive a control bit CTRL2a. As mentioned above, the CTRL1a and the CTRL2a are preferably stored in a configuration register (not shown). The resistor R4c is connected between the drain of the transistor p2a and the node r. The resistor R4d is connected between the drain of the transistor n2a and the node r. Preferably, the resistors R4c and R4d each have resistance R4.

Since the third voltage divider 208A has the additional control bits CTRL1a and CTRL2b, it is possible to make a wider range of adjustments on the output voltage Vr with the third voltage divider 208A than with the second voltage divider 208. Therefore, the duty cycle correction circuit 106 of FIG. 2, with the third voltage divider 208A replacing the second voltage divider 208, can make a finer adjustment on the duty cycle of the CLK_OUT or the LOC_CLK. For example, assume that the CTRL1, the CTRL1a, the CTRL2, and the CTRL2a are respectively 1, 0, 1, and 1. Then, the transistors p2, p2a, n2, and n2a are respectively turned off, turned on, turned on, and turned on. In this case, the output voltage Vr is determined by the resistors R3a, R3b, R4b, R4c, and R4d:

$$Vr=[(R3//(0.5*R4))/((R3//(0.5*R4))+R3//R4)]*Vdd, \text{ where } R3//R4= R3*R4/(R3+R4) \text{ and } R3//(0.5*R4)=0.5*R3*R4/(R3+0.5*R4).$$

It is noted that adding more control bit inputs with accompanying components in a similar fashion enables further finer adjustments of the duty cycle of the CLK_OUT or the LOC_CLK. Since such additional variations are straightforward and can be easily made by a person with ordinary skill in the art, they are considered to fall within the spirit of the present invention.

Figure 4A:
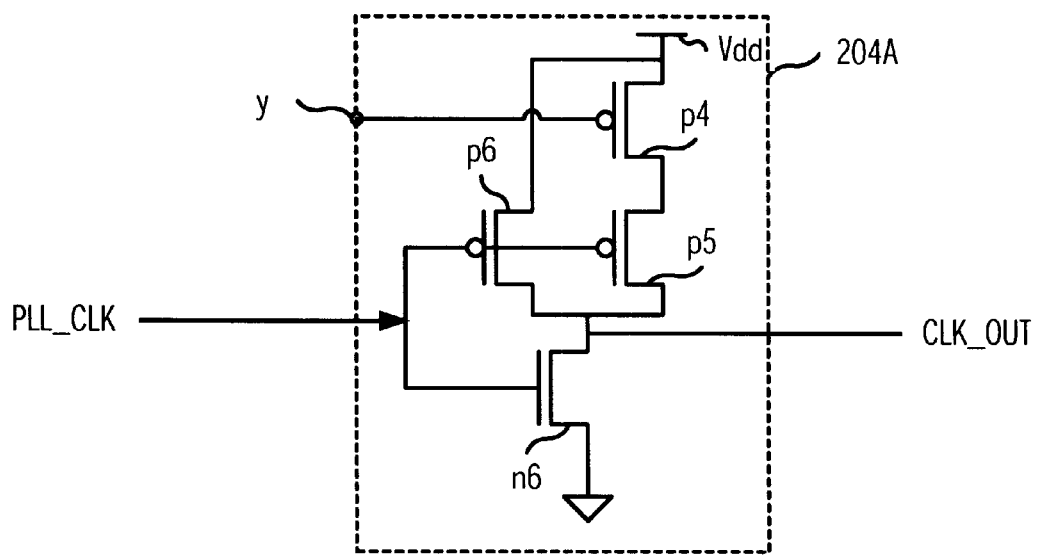
FIG. 4 depicts various embodiments of a first clock-inverter circuit of FIG. 2 according to the present invention.

Now referring to FIG. 4A, a second clock-inverter circuit 204A is another embodiment of the first clock-inverter circuit 204 of FIG. 2. The second clock-inverter circuit 204A has transistors p4, p5, p6, and n6. The source of the transistor p4 is connected to the supply voltage Vdd, whereas the source of the transistor n6 is connected to ground. The drain of the transistor p4 is connected to the source of the transistor p5, whereas the drain of the transistor n6 is connected to the drain of the transistor p5. The source and drain of the transistor p6 are respectively connected to the supply voltage Vdd and the drain of the transistor n6. The gate of the transistor p4 is connected to the node y. The gates of the transistor p5, p6, and n6 are all connected together to receive the PLL_CLK. The CLK_OUT is taken at the drain of the transistor p5, p6, or n6.

The second clock-inverter circuit 204A is configured to adjust the transitional delay in the rising edge of each clock pulse of the CLK_OUT, which subsequently affects the duty cycle of the LOC_CLK, without changing the transitional delay in the falling edge of each clock pulse of the CLK_OUT. This is because the delay-control voltage Vy controls the transistors p4. If the delay-control voltage Vy is below the threshold voltage of the transistor p4, the transistor p4 is turned on, thereby providing an additional path to pull up the CLK_OUT when the PLL_CLK transitions from a logical 1 to a logical 0. This additional path comprising the transistors p4 and p5 decreases the transitional delay in the rising edge of the CLK_OUT. On the other hand, if the delay-control voltage Vy is above the threshold voltage of the transistor p4, the transistor p4 is turned off, thereby elimination the additional path to pull up the CLK_OUT when the PLL_CLK transitions from a logical 1 to a logical 0. This lack of the additional path comprising the transistors p4 and p5 increases the transitional delay in the rising edge of the CLK_OUT. However, the delay-control voltage does not affect the falling edge delay of the CLK_OUT, because only the transistor n6 determines the falling edge delay of the CLK_OUT.

Therefore, the first clock-inverter circuit 204A is used in the duty cycle correction circuit 106, when the PLL 104 of FIG. 1 is non-inverting and samples the rising edge of each clock pulse of the PLL_CLK. This ensures that the duty cycle correction circuit 106 does not affect the functions performed by the PLL 104.

Figure 4B:
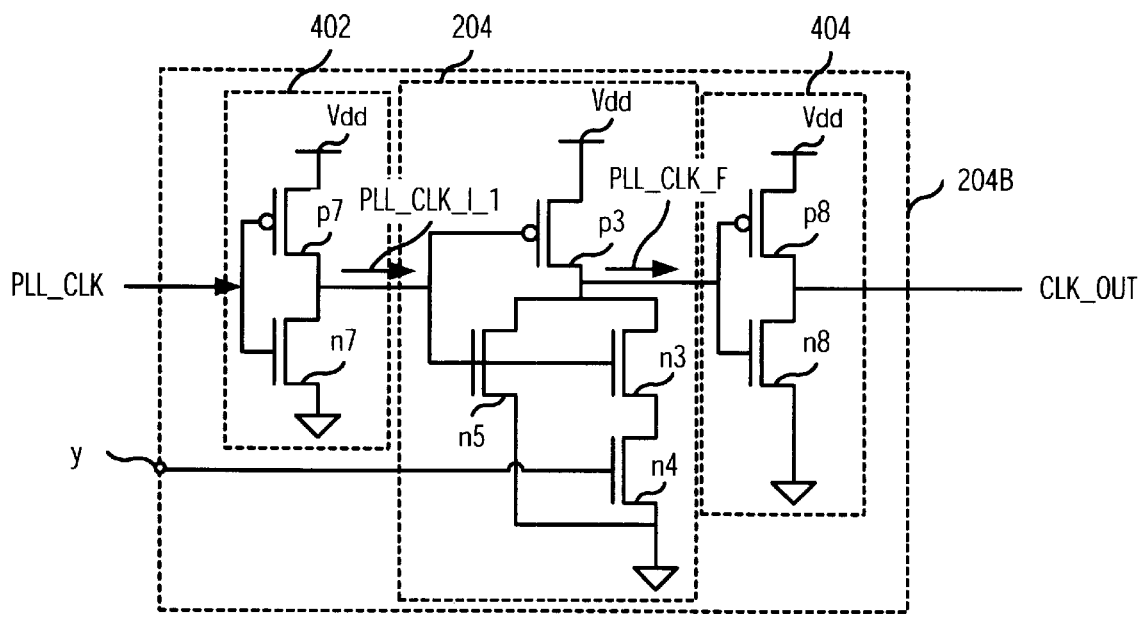

In FIG. 4B, a third clock-inverter circuit 204B is presented. The third-clock inverter circuit 204B has the first clock-inverter circuit 204, a second transistor inverter 402, and a third transistor inverter 404. The second transistor inverter 402 comprises transistors p7 and n7. The third transistor inverter 404 comprises transistors p8 and n8. The second transistor inverter 402 is configured to receive the PLL_CLK through the gates of the transistors p7 and n7. The second transistor inverter 402 inverts the PLL_CLK and outputs a clock signal PLL_CLK_I_1, an inverted version of the PLL_CLK. The PLL_CLK_I_1 is provided to the first clock-inverter circuit 204 to control the gates of the transistors p3, n3, and n5. The first clock-inverter circuit 204 once again inverts the PLL_CLK_1, and outputs a clock signal PLL_CLK_F. Thus, the PLL_CLK_F has the same polarity as the PLL_CLK with its "falling" edge adjusted by the delay-control voltage Vy applied at the node y. The PLL_CLK_F is provided to the third transistor inverter 404, which outputs the CLK_OUT. Therefore, the CLK_OUT is an inverted signal of the PLL_CLK with its "rising" edge adjusted by the delay-control voltage Vy applied at node y.

Figure 4C:
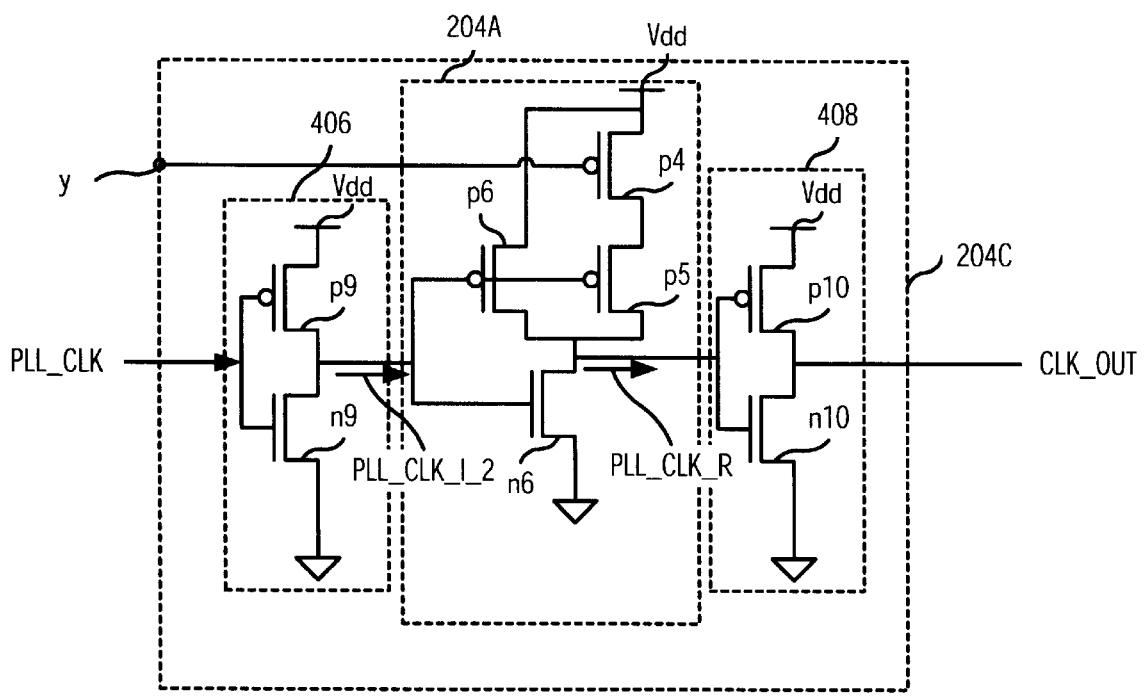

In FIG. 4C, a fourth clock-inverter circuit 204C is presented. The fourth clock-inverter circuit 204C has the second clock-inverter circuit 204A, a fourth transistor inverter 406, and a fifth transistor inverter 408. The fourth transistor inverter 406 comprises transistors p9 and n9. The fifth transistor inverter 408 comprises transistors p10 and n10. The fourth transistor inverter 406 is configured to receive the PLL_CLK through the gates of the transistors p9 and n9. The fourth transistor inverter 406 inverts the PLL_CLK and outputs a clock signal PLL_CLK_I_2, an inverted version of the PLL_CLK. The PLL_CLK_I_2 is provided to the second clock-inverter circuit 204A to control the gates of the transistors p5, p6, and n6. The second clock-inverter circuit 204A once again inverts the PLL_CLK_I_2, and outputs a clock signal PLL_CLK_R. Thus, the PLL_CLK_R has the same polarity as the PLL_CLK with its "rising" edge adjusted by the delay-control voltage Vy applied at the node y. The PLL_CLK_R is provided to the fifth transistor inverter 408, which outputs the CLK_OUT. Therefore, the CLK_OUT is an inverted signal of the PLL_CLK with its "falling" edge adjusted by the delay-control voltage Vy applied at node y.

It is noted that the second, third, and fourth clock-inverter circuits 204A, 204B, and 204C shown in FIGS. 4A, 4B, and 4C are merely examples of some variations of the first clock-inverter circuit 204, and that further variations of the first clock-inverter circuit 204 in the manner suggested in FIGS. 4A, 4B, and 4C should be considered within the spirit of the present invention.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A duty cycle correction circuit comprising:
 a delay-control circuit configured to receive a first clock signal and generate a delay-control voltage, wherein the first clock signal consists of a train of clock pulses, each of which clock pulses has a rising clock edge and a falling clock edge, the delay-control circuit including:
  a first voltage divider configured to receive the first clock signal and generate a first output voltage representing a dc average of the first clock signal;
  a second voltage divider configured to generate a second output voltage;
  a differential amplifier having first and second input terminals and an output terminal, wherein the first input terminal is coupled to the first voltage divider to receive the first output voltage, wherein the second input terminal is coupled to the second voltage divider to receive the second output voltage, and wherein the output terminal outputs a third output voltage; and
  a stability circuit coupled to the output terminal to receive the third output voltage and generate the delay-control voltage by stabilizing the third output voltage; and
 a clock-inverter circuit configured to receive a second clock signal and the delay-control voltage and to generate a third clock signal, wherein the clock-inverter circuit is biased with first and second bias voltages, the clock-inverter circuit including:
  a first field effect transistor (FET) having a source, a gate, and a drain, wherein the gate of the first FET is coupled to the delay-control voltage, and wherein the source of the first FET is coupled to the first bias voltage;
  a second FET having a source, a gate, and a drain, wherein the source of the second FET is coupled to the first bias voltage, wherein the gate of the second FET receives the second clock signal, and wherein the drain of the second FET outputs the third clock signal;
  a third FET having a source, a gate, and a drain, wherein the source of the third FET is coupled to the drain of the first FET, wherein the gate of the third FET is coupled to the gate of the second FET, and wherein the drain of the third FET is coupled to the drain of the second FET; and
  a fourth FET having a source, a gate, and a drain, wherein the source of the fourth FET is coupled to the second bias voltage, wherein the gate of the fourth FET is coupled to the gates of the second and third FETs, and wherein the drain of the fourth FET is coupled to the drains of the second and third FETs.

2. The duty cycle correction circuit of claim 1, wherein the first clock signal is a feedback signal of the third clock signal.

3. The duty cycle correction circuit of claim 1, wherein the first voltage divider comprises:
- a first transistor inverter configured to receive the first clock signal and generate an inverted version of the first clock signal;
- first and second capacitors coupled in series between a supply voltage and ground, wherein the first and second capacitors have a substantially identical capacitance; and
- a first resistor coupled between an output of the first transistor inverter and a connection point between the first and second capacitors, wherein the first output voltage is applied between the connection point and ground.

4. The duty cycle correction circuit of claim 3, wherein the first transistor inverter comprises fifth and sixth FETs, the fifth and sixth FETs each having a source, a gate, and a drain, wherein the source of the fifth FET is coupled to the supply voltage, wherein the drain of the fifth FET is coupled to the drain of the sixth FET to form the output of the first transistor inverter, wherein the source of the sixth FET is coupled to ground, and wherein the gates of the fifth and sixth FETs are coupled together to receive the first clock signal.

5. The duty cycle correction circuit of claim 4, wherein the fifth and sixth FETs are respectively p-channel and n-channel FETs.

6. The duty cycle correction circuit of claim 4 wherein the fifth and sixth FETs have approximately equal device strengths.

7. The duty cycle correction circuit of claim 4 wherein the resistance of the first resistor is much larger than the resistances of the fifth and sixth FETs.

8. The duty cycle correction circuit of claim 3 wherein a time constant formed by the first resistor and one of the first and second capacitors is much larger than the clock period of the first clock signal.

9. The duty cycle correction circuit of claim 1, wherein the second voltage divider comprises:
- a seventh FET having a source, a gate, and a drain, wherein the seventh FET is a p-channel FET, wherein the source of the seventh FET is coupled to a supply voltage, and wherein the gate of the seventh FET receives a first control bit;
- an eighth FET having a source, a gate, and a drain, wherein the eighth FET is an n-channel FET, wherein the source of the eighth FET is coupled to ground, and wherein the gate of the eighth FET receives a second control bit;
- second and third resistors coupled in series between the drain of the seventh FET and the drain of the eighth FET, the second resistor being coupled to the third resistor at a node to which the second output voltage is applied;
- fourth and fifth resistors coupled in series between the supply voltage and ground, the fourth resistor being coupled to the fifth resistor at the node to which the second output voltage is applied; and
- third and fourth capacitors coupled in series between the supply voltage and ground, the third capacitor being coupled to the fourth capacitor at the node to which the second output voltage is applied.

10. The duty cycle correction circuit of claim 9, wherein the second and third resistors have a substantially identical resistance, wherein the fourth and fifth resistors have a substantially identical resistance, wherein the resistance of the second resistor is much greater than the resistance of the fourth resistor, and wherein the seventh and eighth FETs are much stronger than the second and third resistors.

11. The duty cycle correction circuit of claim 9, wherein the first and second control bits control the duty cycle of the first and third clock signals in a steady state.

12. The duty cycle correction circuit of claim 9, wherein the first and second control bits control the duty cycle of the first and third clock signals in a steady state, wherein the duty cycle is fifty percent in a steady state when the first and second control bits have different values, wherein the duty cycle is slightly over fifty percent in a steady state when the first and second control bits have a logical 1, and wherein the duty cycle is slightly below fifty percent in a steady state when the first and second control bits have a logical 0.

13. The duty cycle correction circuit of claim 9, further comprising:
- a ninth FET having a source, a gate, and a drain, wherein the ninth FET is a p-channel FET, wherein the source of the seventh FET is coupled to the supply voltage, and wherein the gate of the ninth FET receives a third control bit;
- a tenth FET having a source, a gate, and a drain, wherein the tenth FET is an n-channel FET, wherein the source of the tenth FET is coupled to ground, and wherein the gate of the tenth FET receives a fourth control bit; and
- sixth and seventh resistors coupled in series between the drain of the ninth FET and the drain of the tenth FET, the sixth resistor being coupled to the seventh resistor at the node to which the second output voltage is applied.

14. The duty cycle correction circuit of claim 1, wherein the first and second input terminals are respectively an inverting input terminal and a non-inverting input terminal of the differential amplifier, and wherein the first clock signal logically equals the third clock signal in a steady state.

15. The duty cycle correction circuit of claim 1, wherein the first and second input terminals are respectively a non-inverting input terminal and an inverting input terminal of the differential amplifier, and wherein the first clock signal is an inverted version of the third clock signal in a steady state.

16. The duty cycle correction circuit of claim 1, wherein the stability circuit comprises:
- an eighth resistor coupled between the output terminal of the differential amplifier and a node to which the delay-control voltage is applied; and
- fifth and sixth capacitors coupled in series between a supply voltage and ground, wherein the fifth and sixth capacitors are coupled to the eighth resistor at the node to which the delay-control voltage is applied.

17. The duty cycle correction circuit of claim 1, wherein the first, second, and third FETs are n-channel FETs, wherein the fourth FET is a p-channel FET, wherein the first and second bias voltages are respectively ground and a supply voltage, and wherein the duty cycle correction circuit adjusts the falling clock edge of each clock pulse of the third clock signal, thereby adjusting the duty cycles of the first and third clock signals.

18. The duty cycle correction circuit of claim 1, wherein the first, second, and third FETs are p-channel FETs, wherein the fourth FET is a n-channel FET, wherein the first and second bias voltages are respectively a supply voltage and ground, and wherein the duty cycle correction circuit adjusts the rising clock edge of each clock pulse of the third clock signal, thereby adjusting the duty cycles of the first and third clock signals.

19. A duty cycle correction circuit comprising:

a delay-control circuit configured to receive a first clock signal and generate a delay-control voltage, wherein the first clock signal consists of a train of clock pulses, each of which clock pulses has a rising clock edge and a falling clock edge, the delay-control circuit including:

a first voltage divider configured to receive the first clock signal and generate a first output voltage representing a dc average of the first clock signal;

a second voltage divider configured to generate a second output voltage;

a differential amplifier having first and second input terminals and an output terminal, wherein the first input terminal is coupled to the first voltage divider to receive the first output voltage, wherein the second input terminal is coupled to the second voltage divider to receive the second output voltage, and wherein the output terminal outputs a third output voltage; and a stability circuit coupled to the output terminal to receive the third output voltage and generate the delay-control voltage by stabilizing the third output voltage; and a clock-inverter circuit configured to receive a second clock signal and the delay-control voltage and to generate a third clock signal, wherein the clock-inverter circuit is biased with first and second bias voltages, the clock-inverter circuit including:

a first field effect transistor (FET) having a source, a gate, and a drain, wherein the gate of the first FET is coupled to the delay-control voltage, and wherein the source of the first FET is coupled to the first bias voltage;

a second FET having a source, a gate, and a drain, wherein the source of the second FET is coupled to the first bias voltage;

a third FET having a source, a gate, and a drain, wherein the source of the third FET is coupled to the drain of the first FET, wherein the gate of the third FET is coupled to the gate of the second FET, and wherein the drain of the third FET is coupled to the drain of the second FET;

a fourth FET having a source, a gate, and a drain, wherein the source of the fourth FET is coupled to the second bias voltage, wherein the gate of the fourth FET is coupled to the gates of the second and third FETs, and wherein the drain of the fourth FET is coupled to the drains of the second and third FETs;

a first transistor inverter having fifth and sixth FETs, the fifth and sixth FETs each having a source, a gate, and a drain, wherein the source of the fifth FET is coupled to the second bias voltage, wherein the source of the sixth FET is coupled to the first bias voltage, wherein the drain of the fifth FET is coupled to the drain of the sixth FET, wherein the gates of the fifth and sixth FETs are coupled together to receive the second clock signal, and wherein the drain of the fifth FET is coupled to the gates of the second, third, and fourth FETs; and a second transistor inverter having seventh and eighth FETs, the seventh and eighth FETs each having a source, a gate, and a drain, wherein the source of the seventh FET is coupled to the second bias voltage, wherein the source of the eighth FET is coupled to the first bias voltage, wherein the drain of the seventh FET is coupled to the drain of the eighth FET, wherein the gates of the seventh and eighth FETs are coupled together to the drain of the fourth FET, and wherein the drain of the seventh FET is configured to output the third clock signal.

* * * * *